(12) United States Patent
Ohno et al.

(10) Patent No.: US 7,838,953 B2
(45) Date of Patent: Nov. 23, 2010

(54) MAGNETIC MEMORY CELL AND MAGNETIC RANDOM ACCESS MEMORY

(75) Inventors: Hideo Ohno, Sendai (JP); Shoji Ikeda, Sendai (JP); Jun Hayakawa, Sendai (JP)

(73) Assignee: Hitachi, Ltd., Tokyo (JP)

( * ) Notice: Subject to any disclaimer, the term of this patent is extended or adjusted under 35 U.S.C. 154(b) by 492 days.

(21) Appl. No.: 11/905,789

(22) Filed: Oct. 4, 2007

(65) Prior Publication Data
US 2008/0105938 A1      May 8, 2008

(30) Foreign Application Priority Data
Oct. 4, 2006      (JP) .............................. 2006-273329

(51) Int. Cl.
*H01L 27/108* (2006.01)
(52) U.S. Cl. ...................... 257/421; 257/295
(58) Field of Classification Search ................. 257/421, 257/295
See application file for complete search history.

(56) References Cited

U.S. PATENT DOCUMENTS 5,695,864 A    12/1997  Slonczewski 6,603,677 B2    8/2003  Redon et al.

FOREIGN PATENT DOCUMENTS

JP    2002-305337    10/2002

OTHER PUBLICATIONS

T. Miyazaki and N. Tezuka,, "Giant Magnetic tunneling Effect in Fe/Al$_2$O$_3$/Fe Junction", Japanese of Magnetism and Magnetic Material 139, L231 (Oct. 1995).
S. Yuasa et al., "Giant Room-Temperature Magnetoresistance in Single-Crystal Fe/MgO/Fe Magnetic Tunnel Junctions", Nature Material 3, 868(Dec. 2004).

*Primary Examiner*—Douglas M Menz
(74) *Attorney, Agent, or Firm*—Antonelli, Terry, Stout & Kraus, LLP.

(57) ABSTRACT

A magnetic memory cell and a magnetic random access memory that are highly reliable and low-power consuming. An upper electrode having a connecting area smaller than the area of a ferromagnetic free layer of a magnetic memory cell is connected to the ferromagnetic free layer. A current is applied to produce an uneven magnetic field over the magnetic memory cell, whereby spin-transfer torque magnetization reversal can be realized with low current and at small write error rate.

8 Claims, 11 Drawing Sheets
(1 of 11 Drawing Sheet(s) Filed in Color)

WHEN $A_C = A_E$

FIG.10

| FERROMAGNETIC FREE LAYER 101 | FERROMAGNETIC PINNED LAYER 103 |
|---|---|
| [Co(100-x)Fe(x)](100-y)B(y)<br>0<x<100 (%), 0<y<30 (%)<br>(CoFeB alloy, including CoB and FeB) | [Co(100-x)Fe(x)](100-y)B(y) |
| | Co(100-x)Fe(x) |
| | NiFe |
| | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| Co(100-x)Fe(x)<br>(CoFe alloy, including Fe and Co)<br>0<x<100 (%) | [Co(100-x)Fe(x)](100-y)B(y) |
| | Co(100-x)Fe(x) |
| | NiFe |
| | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| NiFe | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| [Co(100-x)Fe(x)](100-y)B(y)/Co(100-x)Fe(x)<br>Double-layer ferromagnetic layer<br>0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| [Co(100-x)Fe(x)](100-y)B(y)/NiFe<br>Double-layer ferromagnetic layer<br>0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| Co(100-x)Fe(x)/NiFe<br>Double-layer ferromagnetic layer<br>0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |

FIG.11

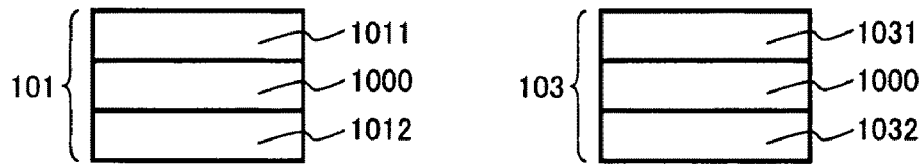

| FIRST FERROMAGNETIC FILM 1011, THIRD FERROMAGNETIC FILM 1012 | SECOND FERROMAGNETIC FILM 1031, FOURTH FERROMAGNETIC FILM 1032 |
|---|---|
| [Co(100-x)Fe(x)](100-y)B(y)<br>0<x<100 (%), 0<y<30 (%)<br>(CoFeB alloy, including CoB and FeB) | [Co(100-x)Fe(x)](100-y)B(y) |
| | Co(100-x)Fe(x) |
| | NiFe |
| | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| Co(100-x)Fe(x)<br>(CoFe alloy, including Fe and Co)<br>0<x<100 (%) | [Co(100-x)Fe(x)](100-y)B(y) |
| | Co(100-x)Fe(x) |
| | NiFe |
| | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| NiFe | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| [Co(100-x)Fe(x)](100-y)B(y)/Co(100-x)Fe(x)<br>Double-layer ferromagnetic layer<br>0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| [Co(100-x)Fe(x)](100-y)B(y)/NiFe<br>Double-layer ferromagnetic layer<br>0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |
| Co(100-x)Fe(x)/NiFe<br>Double-layer ferromagnetic layer<br>0<x<100 (%), 0<y<30 (%) | [Co(100-x)Fe(x)](100-y)B(y)/Co(100-x)Fe(x) |
| | [Co(100-x)Fe(x)](100-y)B(y)/NiFe |
| | Co(100-x)Fe(x)/NiFe |
| | [Co(100-x)Fe(x)](100-y)B(y) |
| | Co(100-x)Fe(x) |
| | NiFe |

CONVENTIONAL PULSE WAVEFORM

MAGNETIC MEMORY CELL AND MAGNETIC RANDOM ACCESS MEMORY

CLAIM OF PRIORITY

The present application claims priority from Japanese application JP2006-273329 filed on Oct. 4, 2006, the content of which is hereby incorporated by reference into this application.

BACKGROUND OF THE INVENTION

1. Field of the Invention

The present invention relates to a nonvolatile magnetic memory and a magnetic random access memory that are low-power consuming and highly reliable.

2. Background Art

Magnetic random access memory is gaining attention as a nonvolatile memory that has the potential to realize a "universal memory," which combines the attributes of high integration, high access speed, and low power consumption. A magnetic random access memory comprises a magnetic memory cell consisting of a tunneling magnetoresistive element having Al or Mg oxide in an insulation film (T. Miyazaki and N. Tezuka, J. Magn. Magn. Mater. 139, L231 (1995); and S. Yuasa et al., Nature Material 3, 868 (2004)), and a transistor for selecting the magnetic memory cell. Information is read via the output voltage of the tunneling magnetoresistive element. Conventionally, information is written by applying a voltage to a bit line and a word line to produce a current-induced spatial magnetic field, with which the magnetization direction of the ferromagnetic free layer of the tunneling magnetoresistive element. As the magnetic memory cells become increasingly finer due to increases in the level of integration, the volume of the ferromagnetic free layer decreases, resulting in an increase in the magnetic field required for magnetization reversal. As a result, more current is required for writing and power consumption increases. In another information writing method, current is caused to flow through the tunneling magnetoresistive element so as to rotate magnetization. This is the so-called spin-transfer torque magnetization reversal method, which is synonymous with the spin-injection magnetization reversal method, which is disclosed in U.S. Pat. No. 5,695,864 and JP Patent Publication (Kokai) No. 2002-305337 A, for example. Such write method, as opposed to the aforementioned method involving the spatial magnetic field, is capable of reducing the current required for writing even when the size of the ferromagnetic free layer of a tunneling magnetoresistive element becomes increasingly finer due to increases in integration. Thus, this write method is advantageous for reduction of power consumption.

SUMMARY OF THE INVENTION

In the write method based on spin-transfer torque magnetization reversal, as shown in FIGS. 14A to 14C, the threshold current for spin-transfer torque magnetization reversal is known to greatly increase below 10 nanoseconds, which is the general memory write operation time, resulting in an error in magnetization reversal. FIG. 14A shows a plot of reversal probability relative to write current, cited from Appl. Phys. Lett. 85, 5358 (2004). It can be seen from this figure that there are regions where reversal probability is neither 0 nor 1, and that in a region having a short write time, the value of write current that produces the reversal probability of 1 is greatly increased. FIG. 14B shows the magnitude of write current relative to write time; it can be seen that in the region of write time of 10 nanoseconds or less, write current is increased. FIG. 14C shows a plot of reversal probability relative to write current; it can be seen that there are current regions where reversal probability is neither 0 nor 1 (greater than $I_1$ and smaller than $I_2$).

Writing of magnetic memory information normally needs to be performed in 10 nanoseconds or less. In order to realize a highly integrated nonvolatile magnetic memory that is low-power consuming and highly reliable, it is necessary to reliably reverse the magnetization of a recording layer of a tunneling magnetoresistive element in such short time and with a low current.

It is an object of the present invention to provide a magnetic memory cell and a random access memory that can address such needs.

In accordance with the present invention, a current is caused to flow through an electrode disposed in contact with a ferromagnetic free layer, which is a recording layer of a giant magnetoresistive element or a tunneling magnetoresistive element of a magnetic memory cell, whereby a magnetic field is produced that is applied so as to effect magnetization reversal of the recording layer by spin-transfer torque. The application of the magnetic field is effected such that, based on the arrangement of the ferromagnetic free layer and the electrode displaced adjacent thereto, the direction of the magnetization in the ferromagnetic free layer follows an arc. A magnetic domain having the arc-shaped feature that is produced in the ferromagnetic free layer using a means for applying the magnetic field produced by the current is herein referred to as the C-shaped magnetic domain.

The invention provides a magnetic memory cell comprising:

a magnetoresistive element comprising a ferromagnetic free layer and a ferromagnetic pinned layer between which a nonmagnetic film is disposed;

an upper electrode disposed in contact with an upper surface of the ferromagnetic free layer; and a lower electrode disposed under the ferromagnetic pinned layer, wherein $A_C > A_E$, where $A_C$ is the area of the upper surface of the ferromagnetic free layer and $A_E$ is the area of a connecting surface of the upper electrode that is in contact with the ferromagnetic free layer, and the barycentric coordinates in the upper surface of the ferromagnetic free layer are different from the barycentric coordinates in the connecting surface, wherein the magnetization of the ferromagnetic free layer is reversed by a spin-transfer torque produced by the flow of current through the magnetoresistive element when information is written.

The invention further provides a magnetic memory cell comprising:

a magnetoresistive element comprising a ferromagnetic free layer and a ferromagnetic pinned layer between which a nonmagnetic film is disposed;

an upper electrode disposed in contact with an upper surface of the ferromagnetic free layer; and a lower electrode disposed under the ferromagnetic pinned layer, wherein the entire upper surface of the ferromagnetic free layer is covered with an upper electrode larger than the ferromagnetic free layer, the barycentric coordinates in a lower surface of the upper electrode being different from the barycentric coordinates in the upper surface of the ferromagnetic free layer, wherein the magnetization of the ferromagnetic free layer is reversed by a spin-transfer torque produced by the flow of current through the magnetoresistive element when information is written.

In accordance with the present invention, the current for writing based on spin-transfer torque can be reduced, and the write error rate can be reduced, whereby a highly reliable and low power-consuming nonvolatile memory can be realized.

BRIEF DESCRIPTION OF THE DRAWINGS

The patent or application file contains at least one drawing executed in color. Copies of this patent or patent application publication with color drawings will be provided by the Office upon request and payment of the necessary fee.

FIG. 1A is a perspective view and FIG. 1B is a top plan view.

FIG. 10 shows examples of the materials for the ferromagnetic free layer and the ferromagnetic pinned layer.

FIG. 11 shows examples of the materials for the ferromagnetic free layer and the ferromagnetic pinned layer.

FIG. 12A shows a conventional pulse shape; and FIGS. 12B to 12D show pulse shapes according to the present invention.

DESCRIPTION OF THE PREFERRED EMBODIMENTS

In the following, the present invention is described by way of embodiments thereof with reference made to the drawings. While the present invention is described in the following with reference to examples involving a magnetic memory cell incorporating a tunneling magnetoresistive element, the present invention can be similarly applied to a magnetic memory cell incorporating a giant magnetoresistive element.

Figure 1:
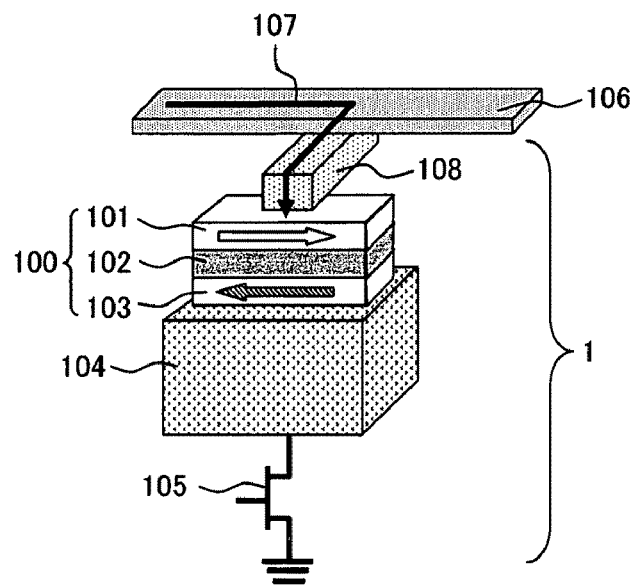
FIGS. 1A and 1B show an example of the structure of a magnetic memory cell according to the present invention.
Figure 1:
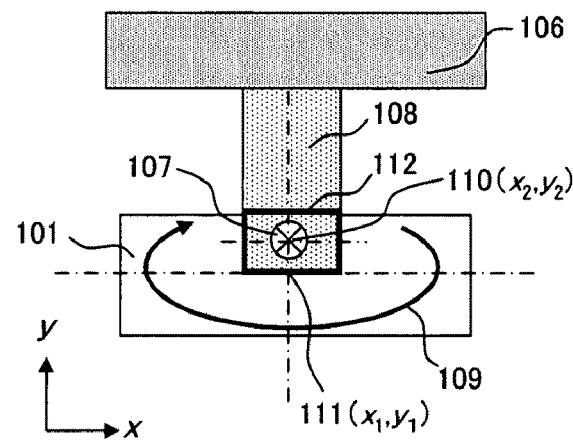

FIGS. 1A and 1B show an example of a magnetic memory cell 1 according to the present invention. FIG. 1A is a perspective view, and FIG. 1B is a top plan view. As shown in FIG. 1A, the magnetic memory cell 1 of the present embodiment comprises: a tunneling magnetoresistive element 100 consisting of a ferromagnetic free layer 101, an insulation film 102, and a ferromagnetic pinned layer 103; a transistor 105 for the turning on/off of current that flows through the tunneling magnetoresistive element 100; a bit line 106; and two electrodes 104 and 108. The lower electrode 104 is connected to the ferromagnetic pinned layer 103 side of the tunneling magnetoresistive element 100. The upper electrode 108 is connected to the ferromagnetic free layer 101 side of the tunneling magnetoresistive element 100. As current flows in the forward direction indicated by the arrow 107 or in the opposite direction, spin-transfer torque is produced, whereby the magnetization of the ferromagnetic free layer 101 is reversed.

Figure 2:
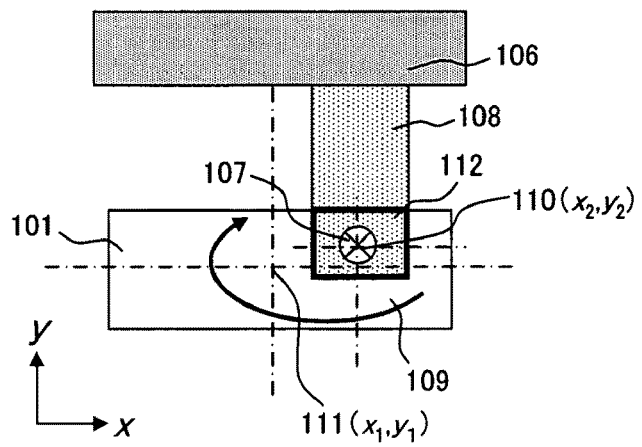
FIGS. 2A and 2B show examples of the arrangement of an upper electrode and a ferromagnetic free layer.
Figure 2:
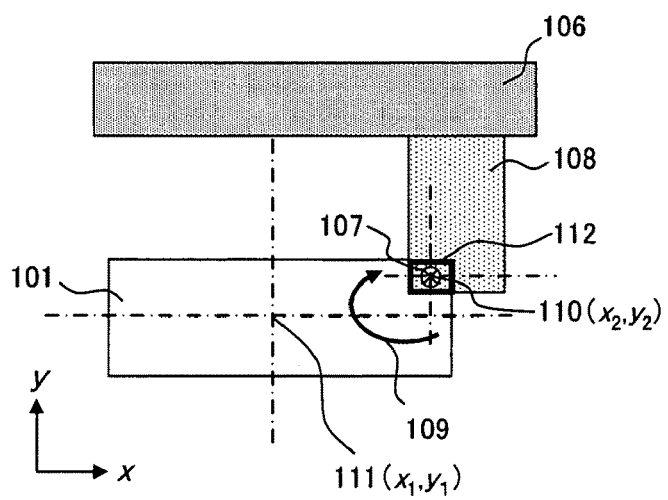
Figure 3:
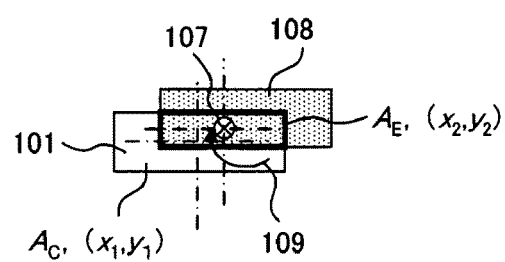
FIG. 3 shows another example of the structure of the magnetic memory cell of present invention.

As shown in FIG. 1B, the ferromagnetic free layer 101 and the upper electrode 108 are connected via a connecting surface 112 enclosed by a solid line. The area of the connecting surface is defined as $A_E(>0)$. The connecting surface 112 has a center of gravity 110 at the coordinates $(x_2, y_2)$ in the surface thereof that is in contact with the ferromagnetic free layer 101. The area of the upper surface of the ferromagnetic free layer 101 is defined as $A_C$. The upper surface of the ferromagnetic free layer 101, which is in contact with the upper electrode 108, has a center of gravity 111 at the coordinates $(x_1, y_1)$. In the case of FIG. 1B, $A_C > A_E$, $x_1 = x_2$, and $y_1 \neq y_2$. In the case of the present embodiment, $A_C > A_E$, and coordinates $(x_2, y_2)$ and coordinates $(x_1, y_1)$ do not correspond with each other. Examples of the arrangement of the ferromagnetic free layer 101 and the upper electrode 108 that satisfy such relationship include the case where, as shown in FIG. 2A, the position of the center of gravity of the connecting surface 112 does not correspond to the position of the center of gravity of the ferromagnetic free layer 101 in the longitudinal direction thereof ($x_1 \neq x_2$), and the case where, as shown in FIG. 2B, the connecting surface 112 is positioned at a corner of the ferromagnetic free layer 101. Alternatively, as shown in FIG. 3, a case is also included in which the area $A_C$ of the upper surface of the ferromagnetic free layer 101 is equal to the area of the lower surface of the upper electrode 108 while they are laterally displaced from each other such that $A_C > A_E$, $x_1 \neq x_2$, and $y_1 \neq y_2$.

With the ferromagnetic free layer 101 and the upper electrode 108 thus arranged, as current 107 flows, a magnetic field 109 is generated. This magnetic field 109 causes the formation of a C-shaped magnetic domain in the ferromagnetic free layer 101, as will be described later.

Figure 4:
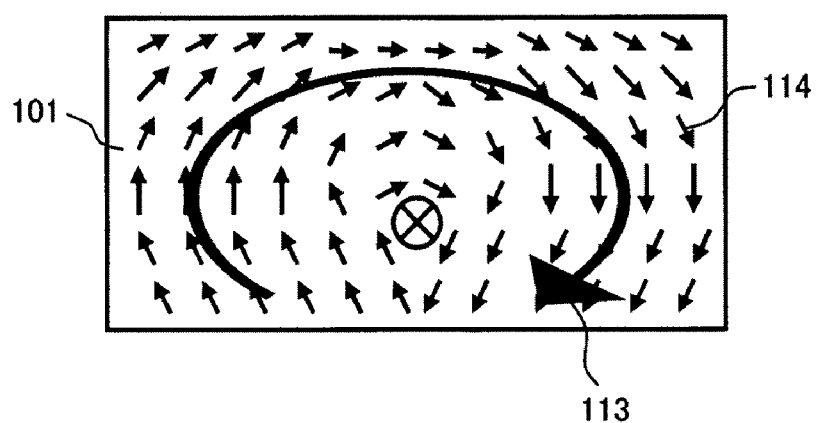
FIGS. 4A and 4B illustrate the characteristics of a magnetic structure that is formed in the ferromagnetic free layer upon application of a current to the magnetic memory cell of the present invention.
Figure 4:
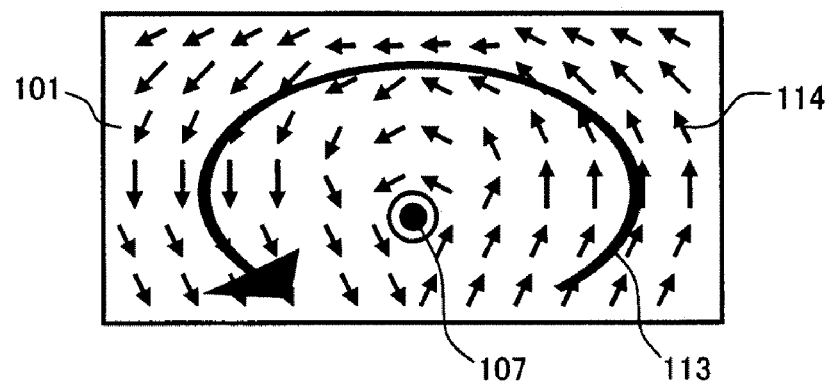

FIGS. 4A and 4B show plan views of the ferromagnetic free layer 101 as seen from the upper electrode 108. With the ferromagnetic free layer 101 and the upper electrode 108 disposed as described above and a current is applied, the magnetic structures shown in FIGS. 4A and 4B can be obtained. FIG. 4A shows an example of the magnetic structure that is obtained when current flows from the upper electrode 108 to the lower electrode 104. FIG. 4B shows an example of the magnetic structure that is obtained when current flows from the lower electrode 104 to the upper electrode 108. Numeral 114 indicates the directions of individual spins in the ferromagnetic free layer 101, which generally follow an overall shape along a magnetic domain direction 113. Such arc-shaped magnetic domain along the magnetic domain direction 113 is defined as the C-shaped magnetic domain. In the case of FIG. 4B, a C-shaped magnetic domain that is directed opposite from FIG. 4A is formed.

When the C-shaped magnetic domain shown in FIGS. 4A and 4B is formed by the applied current 107, it becomes possible to realize fast and smooth spin-transfer torque magnetization reversal. Thus, a magnetic memory cell and a magnetic random access memory that are low-power consuming and highly reliable can be realized. At the moment of application of current between the lower electrode 104 and the upper electrode 108, the individual spins 114 receive the energy of spin-transfer torque and start a rotating motion called precession, and gradually change their directions. The individual spins 114 in the ferromagnetic free layer 101 then rotate all at once while forming the C-shaped magnetic domain as a whole as shown in FIG. 4A or FIG. 4B. If, on the other hand, the C-shaped magnetic domain is not formed, the individual spins 114 are reversed in a disorderly manner, and sometimes the entire spins do not become reversed eventually, resulting in the presence of a magnetization reversal error. When the C-shaped magnetic domain is formed in the presence of spin-transfer torque magnetization reversal, the spins 114 can smoothly rotate all at once.

Figure 5:
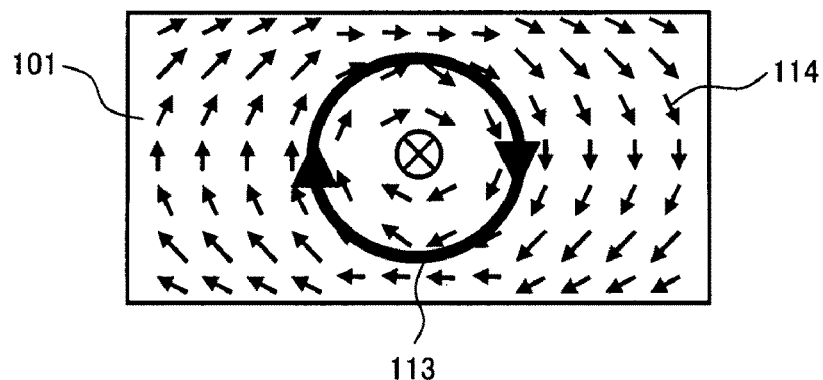
FIG. 5 illustrates the characteristics of a magnetic structure that is formed in the ferromagnetic free layer upon application of a current to a conventional magnetic memory cell.

By disposing the upper electrode 108 and the ferromagnetic free layer 101 as shown in FIGS. 1A and 1B, FIGS. 2A and 2B, or FIG. 3, it becomes possible to always induce the C-shaped magnetic domain shown in FIGS. 4A and 4B inside the ferromagnetic free layer 101 by causing the current 107 to flow between the electrodes 104 and 108. Thus, spin-transfer torque magnetization reversal can be realized fast, smoothly, and with a low error rate. In conventional magnetic memories, the upper electrode 108 and the ferromagnetic free layer 101 are generally arranged such that $A_C=A_E$, $x_1=x_2$, and $y_1=y_2$. In this case, a magnetic domain is formed inside the ferromagnetic free layer 101 by the magnetic field produced by the applied current 107. The magnetic domain in this case is concentric with respect to the center of the plane of the ferromagnetic free layer 101, as shown in FIG. 5. When such magnetic domain is formed, a coherent reversal cannot be realized during the spin torque magnetization reversal process, and a fast reversal cannot be expected.

Figure 6:
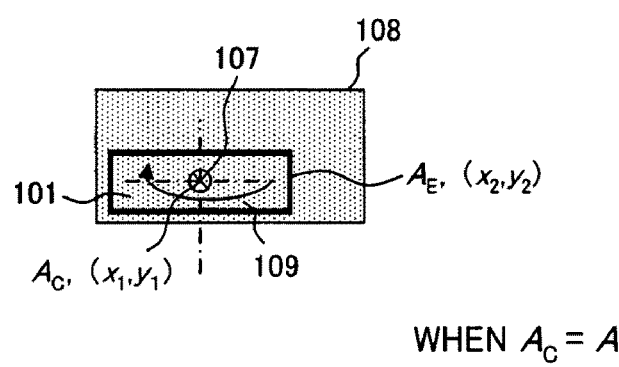
FIG. 6 shows an example of the structure of the magnetic memory cell of the present invention.

While the foregoing description was concerned with the cases where $A_C>A_E$, the effect of the present invention can also be obtained even when $A_C=A_E$ in an arrangement shown in FIG. 6. In this case, the entire upper surface of the ferromagnetic free layer 101 is covered with an upper electrode 108 that is larger than the ferromagnetic free layer 101, where the barycentric coordinates in the lower surface of the electrode 108 do not correspond with the barycentric coordinates of the ferromagnetic free layer 101. In this case, $A_C=A_E$, $x_1=x_2$, and $y_1=y_2$; however, upon application of the current 107, a C-shaped magnetic domain directed as indicated by the arrow 109 is formed in the ferromagnetic free layer 101 by a spatial magnetic field produced by the upper electrode 108. In this case, too, since the C-shaped magnetic domain is induced, the spins can rotate all at once more smoothly than they do conventionally.

The above C-shaped magnetic domain contributes to spin-transfer torque magnetization reversal at a small error rate and to the smooth reversal of the magnetizations in the ferromagnetic free layer 101 all at once. Further, with the C-shaped magnetic domain formed, the spatial magnetic field produced by the current 107 is superposed, whereby the threshold current density ($J_c$) of the spin torque magnetization reversal can be reduced.

Figure 7:
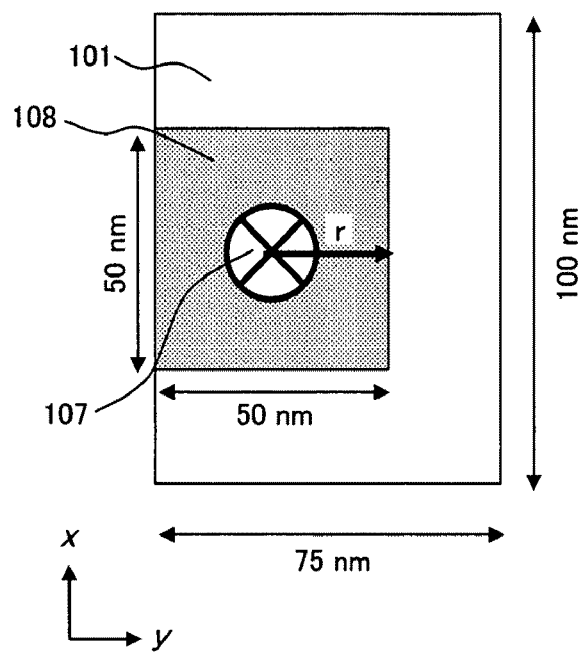
FIGS. 7A and 7B indicate the size of the current-induced magnetic field, FIG. 7A illustrating the production of magnetic field and FIG. 7B showing the relationship between the distance of a magnetic field from an electrode and the magnitude of the magnetic field.
Figure 7:
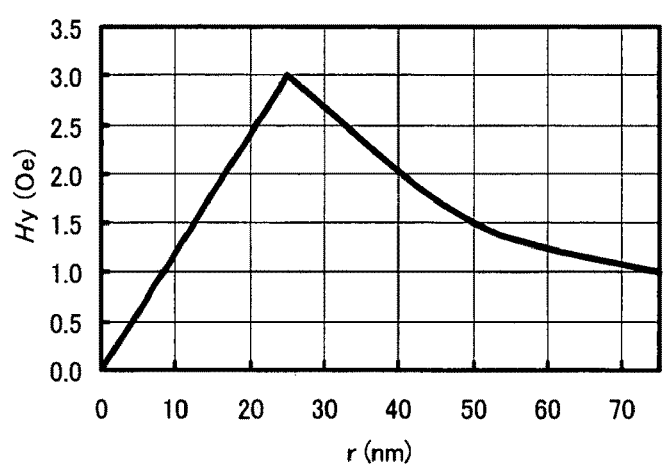
Figure 8:
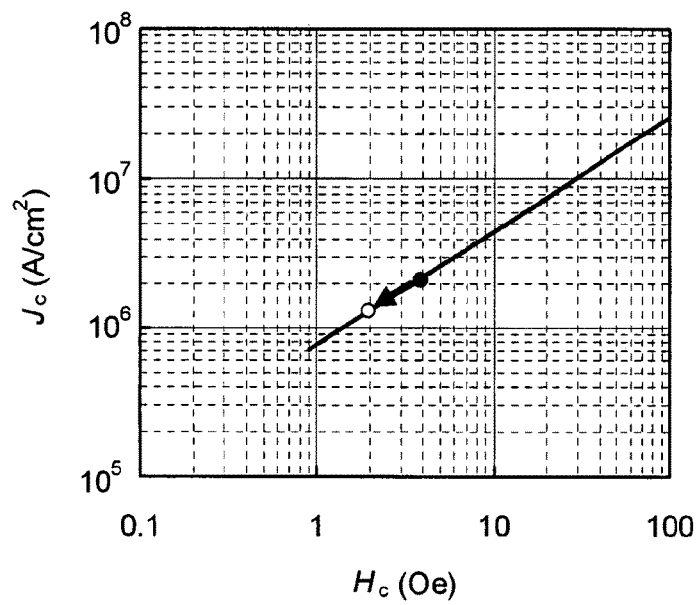
FIG. 8 shows the relationship between the ferromagnetic free layer coercivity $H_c$ and the threshold current density $J_c$ required for spin-transfer torque magnetization reversal in a magnetic memory cell of the present invention.

FIG. 7A shows an example in which the upper electrode 108 is connected to the ferromagnetic free layer 101 having an area of 75 nm×100 nm, via an area measuring 50 nm×50 nm. FIG. 7B shows the magnitude of the magnetic field produced by the current 107 having the current density of $2\times10^6$ A/cm², for example, at a location spaced apart from the center of the current by distance r in the y direction. It is seen that the magnetic field produced by the current 107 has the maximum magnitude 30e at the distance of 25 nm from the current center. On the other hand, $J_c$ of the spin-transfer torque of the magnetoresistive element 100 depends on the coercivity ($H_c$) of the ferromagnetic free layer 101 of the magnetoresistive element 100. For example, $J_c$ exhibits a characteristic shown by the solid line in FIG. 8 relative to coercivity $H_c$, where $J_c$ decreases as coercivity becomes smaller. Now, the example of the magnetoresistive element shown in FIGS. 7A and 7B, which has the current density of $2\times10^6$ A/cm² for $J_c$, is considered. The relationship between $J_c$ and $H_c$ varies depending on the material and shape of the ferromagnetic free layer, or the magnetoresistance ratio of the magnetoresistive element 100. $J_c=2\times10^6$ A/cm² corresponds to the data indicated by the black dot in FIG. 8. In such magnetoresistive element, $H_c=4$ Oe. When, as shown in FIGS. 7A and 7B, the magnitude of the maximum magnetic field produced by the current 107 in the ferromagnetic free layer 101 is 3 Oe, $H_c=1$ Oe effectively, so that $J_c$ substantially can take the value indicated by the white dot, namely, $1.5\times10^6$ A/cm². The reduction of $J_c$ by the magnetic field produced by the current 107 described herein can also be realized in other arrangements of the ferromagnetic free layer 101 and the upper electrode 108 than that of the present example. The reduction of $J_c$ is an effect produced by the superposition of the magnitude of a spatial magnetic field, on the basis of the establishment of the C magnetic domain shape.

Figure 9:
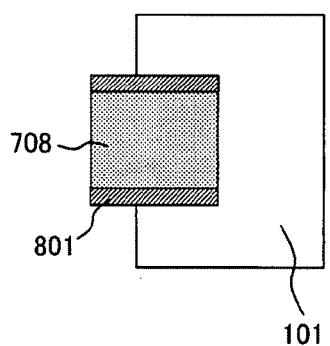
FIGS. 9A and 9B show top plan views of a connecting portion between an upper electrode coated with ferromagnetic material and the ferromagnetic free layer.
Figure 9:
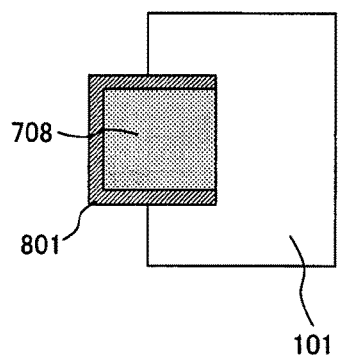

Hereafter the structural and material characteristics of the upper electrode 108 are described. FIGS. 9A and 9B show top plan views of the connecting portion between the upper electrode 108 and the ferromagnetic free layer 101. While normally the upper electrode 108 is composed of nonmagnetic metal material, such as Cu or Al, it can also have a structure consisting of a nonmagnetic metal material 708 covered with a ferromagnetic metal layer 801, as shown in FIGS. 9A and 9B. The film thickness of the ferromagnetic metal layer 801 is preferably 100 nm or less. The ferromagnetic metal layer 801 is preferably made of a material containing at least one of elements Co, Fe, and Ni. The ferromagnetic metal layer 801 is preferably made by sputtering; however, other methods, such as electrolytic plating, electroless plating, or a physical deposition method other than sputtering, may be employed. By employing such electrode, the magnetic field that is produced upon application of current can be increased by a factor of about 2, whereby $J_c$ can be reduced.

In the following, the material compositions of the magnetoresistive element 100 used in a structure capable of forming the aforementioned C-shaped magnetic domain is described. FIG. 10 shows the material compositions used for the ferromagnetic free layer 101 and the ferromagnetic pinned layer 103, and combinations thereof. In the ferromagnetic free layer 101 and the ferromagnetic pinned layer 103, magnetic materials such as CoFeB, CoFe, CoB, CoFe, Co, Fe, and NiFe can be used in a single layer. The ferromagnetic free layer 101 and the ferromagnetic pinned layer 103 may each comprise a three-layer structure. Specifically, the ferromagnetic free layer 101 may comprise a first ferromagnetic layer 1011 and a third ferromagnetic layer 1012, and the ferromagnetic pinned layer 103 may comprise a second ferromagnetic layer 1031 and a fourth ferromagnetic layer 1032, in accordance with the combinations of materials shown in FIG. 11, with the selection of an intermediate layer 1000 of Ru, for example, that couples antiparalelly. Preferably, these materials are formed by sputtering. By using the materials shown in FIG. 10, it becomes possible to achieve a high tunneling magnetoresistance ratio, low $J_c$, and stable spin torque magnetization reversal. Particularly, the ferromagnetic pinned layer 103, in order to pin its magnetization stably, may be disposed adjacent to an antiferromagnetic film of an Mn compound, such as MnPt, MnFe, or MnIr, for example. The insulation film 102 may be composed of a material such as magnesium oxide, aluminum oxide, or silicon oxide.

Figure 12:
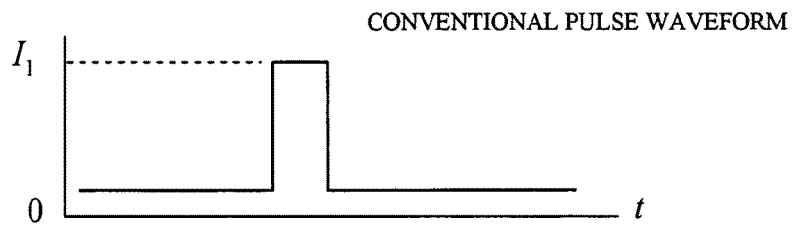
FIGS. 12A to 12D show various pulse shapes that can be used for writing based on spin-transfer torque magnetization reversal.
Figure 12:
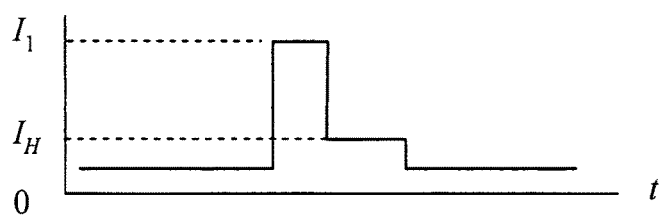
Figure 12:
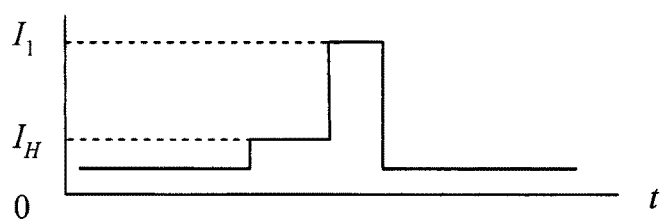
Figure 12:
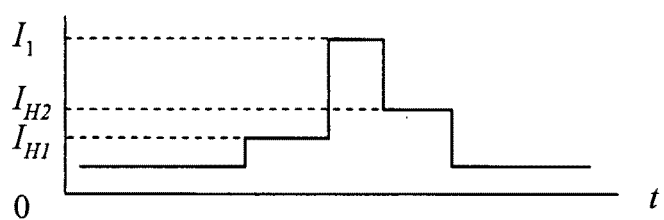

FIGS. 12A to 12D show examples of the method of application of a current pulse for writing in the magnetic memory cell 1 in accordance with the spin-transfer torque magnetization reversal method of the present invention. The illustrated pulse current corresponds to the above described current 107. The current pulse application method shown in FIG. 12A is a conventional method, by which a pulse current ($I_1$) that is rectangular with respect to time and corresponds to $J_c$ is applied. When this method is used, if the applied current pulse width drops below 10 nanoseconds, the magnetization of the ferromagnetic free layer 101 sometimes fail to be reversed, resulting in the problem of memory cell write error. In the current pulse application method shown in FIG. 12B, after the application of $I_1$, a pulse current $I_H$ ($I_H < I_1$) is applied continuously. In the method of FIG. 12C, which is the opposite to the method of FIG. 12B, a pulse current $I_H$ ($I_H < I_1$) is applied prior to the application of $I_1$. In the method of FIG. 12D, $I_{H1}$ ($I_{H1} < I_1$) and $I_{H2}$ ($I_{H2} < I_1$) are applied before and after, respectively, the application of $I_1$. These methods that apply the current pulse $I_H$ ($I_{H1}$, $I_{H2}$) in addition to the $I_1$, as shown in FIG. 12B to 12D, can be expected to provide the effect of assisting spin-transfer torque magnetization reversal and reducing the error rate. The application of $I_H$ enables the formation of the C-shaped magnetic domain in a warm-up phase of spin torque magnetization reversal and thus facilitates the smooth, fast, and complete spin torque magnetization reversal by the $I_1$ application. By applying such current pulse application methods in a magnetic memory cell of such structure as to enable the formation of the C-shaped magnetic domain, the error rate in writing based on spin-transfer torque magnetization reversal can be further reduced.

Figure 13:
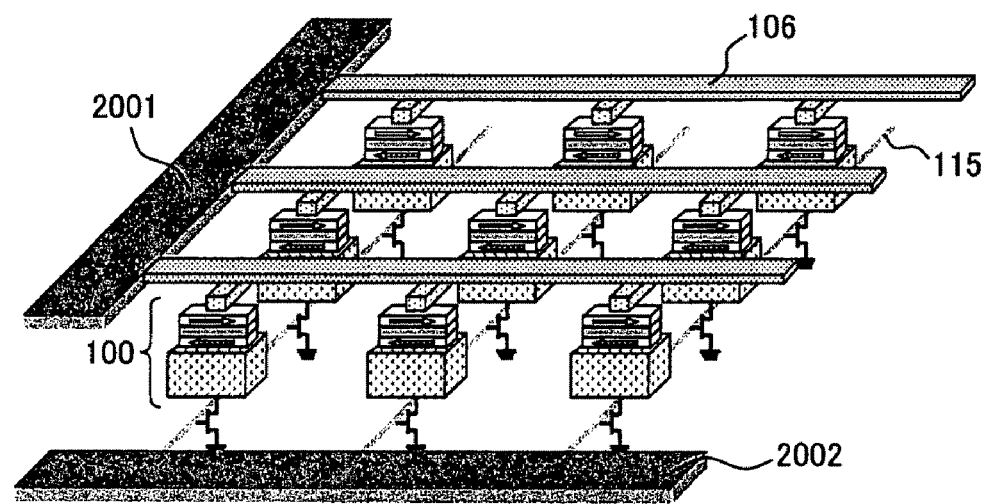
FIG. 13 shows a configuration of the magnetic random access memory of the present invention.
Figure 14A:
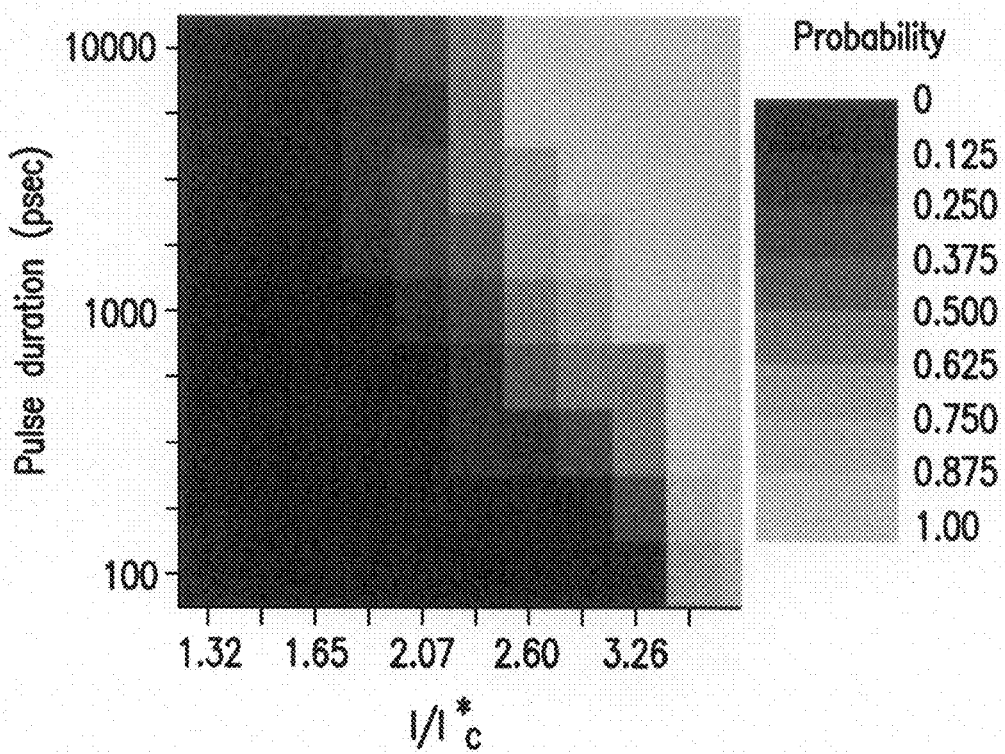
FIGS. 14A to 14C show charts illustrating a problem of a write method based on pin-transfer torque magnetization reversal.
Figure 14B:
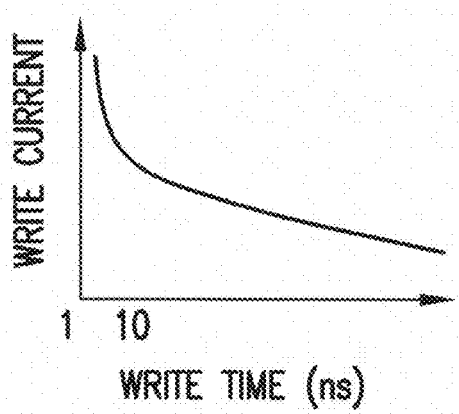
Figure 14C:
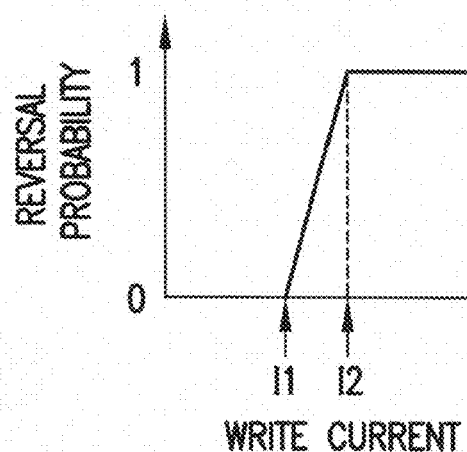

FIG. 13 shows an example of the configuration of the magnetic random access memory of the present invention, in which a plurality of magnetic memory cells 1 are disposed in an array. Bit lines 106 and gate electrodes 115 are electrically connected to the memory cells. A bit line driver 2001 is installed as a driver to control the bit lines 106. A gate driver 2002 is installed as a driver to control the gate electrodes 115. In this way, a magnetic random access memory with the capacity of gigabit-class can be realized.

What is claimed is:

1. A magnetic memory cell comprising:
   a magnetoresistive element comprising a ferromagnetic free layer and a ferromagnetic pinned layer between which a nonmagnetic film is disposed;
   an upper electrode disposed in contact with an upper surface of the ferromagnetic free layer; and
   a lower electrode disposed under the ferromagnetic pinned layer,
   wherein $A_C > A_E$, where $A_C$ is the area of the upper surface of the ferromagnetic free layer and $A_E$ is the area of a connecting surface of the upper electrode that is in contact with the ferromagnetic free layer, and the barycentric coordinates in the upper surface of the ferromagnetic free layer are different from the barycentric coordinates in the connecting surface, wherein the magnetization of the ferromagnetic free layer is reversed by a spin-transfer torque produced by the flow of current through the magnetoresistive element when information is written.

2. The magnetic memory cell according to claim 1, wherein the nonmagnetic film comprises an insulation film.

3. The magnetic memory cell according to claim 1, comprising a switching element for controlling the switching-on and -off of the current through the magnetoresistive element.

4. The magnetic memory cell according to claim 1, wherein the upper electrode comprises a ferromagnetic film.

5. A magnetic random access memory comprising a plurality of magnetic memory cells, and means for selecting a desired magnetic memory cell,
   wherein the magnetic memory cell comprises:
   a magnetoresistive element comprising a ferromagnetic free layer and a ferromagnetic pinned layer between which a nonmagnetic film is disposed;
   an upper electrode disposed in contact with an upper surface of the ferromagnetic free layer; and
   a lower electrode disposed under the ferromagnetic pinned layer,
   wherein $A_C > A_E$, where $A_C$ is the area of the upper surface of the ferromagnetic free layer and $A_E$ is the area of a connecting surface of the upper electrode that is in contact with the ferromagnetic free layer, and the barycentric coordinates in the upper surface of the ferromagnetic free layer are different from the barycentric coordinates in the connecting surface, wherein the magnetization of the ferromagnetic free layer is reversed by a spin-transfer torque produced by the flow of current through the magnetoresistive element when information is written.

6. The magnetic random access memory according to claim 5, wherein the nonmagnetic film comprises an insulation film.

7. The magnetic random access memory according to claim 5, wherein the magnetoresistive element comprises a switching element for controlling the switching-on and -off of the current through the magnetoresistive element.

8. The magnetic random access memory according to claim 5, wherein the upper electrode comprises a ferromagnetic film.

* * * * *

UNITED STATES PATENT AND TRADEMARK OFFICE
CERTIFICATE OF CORRECTION

PATENT NO.         : 7,838,953 B2
APPLICATION NO.    : 11/905789
DATED              : November 23, 2010
INVENTOR(S)        : Ohno et al.

It is certified that error appears in the above-identified patent and that said Letters Patent is hereby corrected as shown below:

Title Page Item (73) Assignees should read:

Hitachi, Ltd.   Tokyo (JP)

Tohoku University    Miyagi (JP)

Signed and Sealed this
Thirty-first Day of May, 2011

David J. Kappos
*Director of the United States Patent and Trademark Office*